United States Patent [19]

Sakurai

[11] 4,139,443
[45] Feb. 13, 1979

[54] PHOTOMASK BLANKS AND METHOD OF PREPARING THE SAME

[75] Inventor: Kunio Sakurai, Hino, Japan

[73] Assignee: Konishiroku Photo Industry Co., Ltd., Tokyo, Japan

[21] Appl. No.: 834,158

[22] Filed: Sep. 19, 1977

[30] Foreign Application Priority Data

Sep. 27, 1976 [JP] Japan .................................. 51-114701

[51] Int. Cl.² .................... C23C 15/00; C23C 13/02; C23C 13/04
[52] U.S. Cl. .............................. 204/192 C; 204/192 P; 427/250; 427/255; 428/433
[58] Field of Search ........................ 204/192 C, 192 P; 428/433; 427/250, 255

[56] References Cited
U.S. PATENT DOCUMENTS

| 3,542,612 | 11/1970 | Cashau et al. | 428/433 |
| 3,600,243 | 8/1971 | La Rocque et al. | 428/433 |
| 3,644,134 | 2/1972 | Widmann et al. | 204/192 P |
| 3,715,244 | 2/1973 | Szupillo | 204/192 P |
| 3,892,571 | 7/1975 | Simeonov et al. | 427/255 |

Primary Examiner—John H. Mack
Assistant Examiner—William Leader
Attorney, Agent, or Firm—Martin A. Farber

[57] ABSTRACT

The photomask blank comprises a transparent substrate, a first chromium film formed on the substrate by sputtering, a second chromium film formed on the first chromium film by vacuum evaporation and a chromium oxide film by vacuum evaporation. The relative thickness of the two chromium films and the chromium oxide film is adjusted to improve resolution of a pattern and to decrease reflectance.

5 Claims, 5 Drawing Figures

FIG. 1
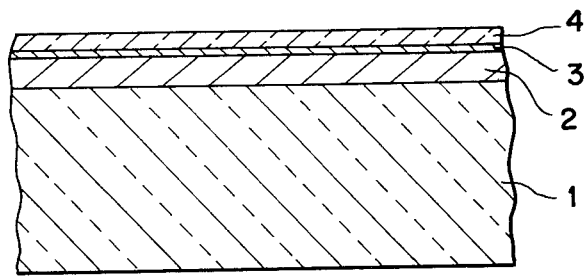
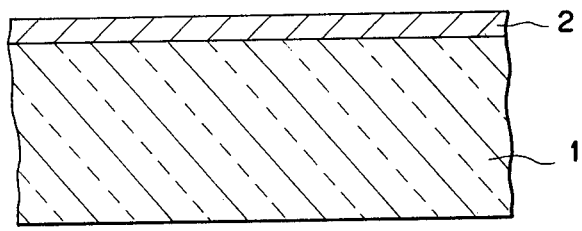
FIG. 2A
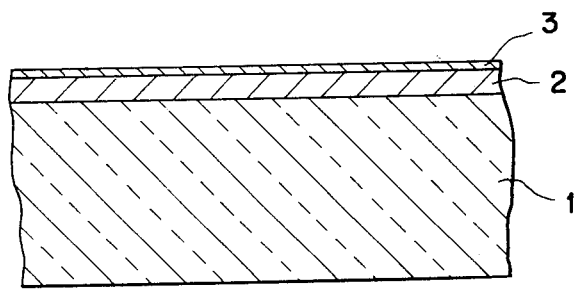
FIG. 2B
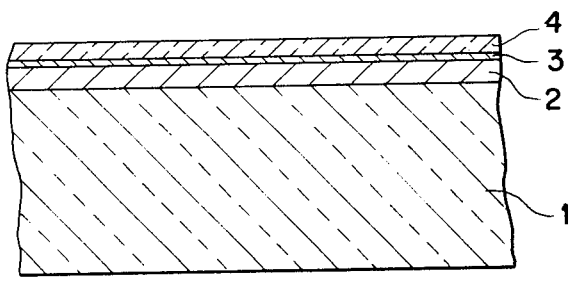
FIG. 2C

PHOTOMASK BLANKS AND METHOD OF PREPARING THE SAME

BACKGROUND OF THE INVENTION

This invention relates to photomask blanks, photomasks prepared therefrom and method of manufacturing the same and more particularly a chromium mask, one of hard masks, utilized to prepare such semiconductor elements as integrated circuits and high density integrated circuits.

In recent years, in the manufacture of semiconductor integrated circuits or the like, a hard mask comprising a transparent substrate made of glass, for example, and a metal film formed thereon is used in most cases in view of its durability and high degree of resolution. A typical hardmask is a chromium mask wherein a chromium film is deposited on a glass substrate by vacuum evaporation or sputtering. However, since the reflectance of the chromium film is very high (about 40 to 60%), the resolution of a circuit pattern formed by using the chromium mask is poor due to multiple reflections of the light between a wafer and the chromium mask during exposure.

To obviate this problem a so-called surface reflection free chromium mask has been proposed in which a chromium oxide film having a thickness of 250 to 350 Å and acting as a anti-reflection film is formed on the chromium film.

A chromium mask blank provided with a chromium oxide film is generally prepared by the following four methods, but the chromium mask blanks prepared by these methods are not always satisfactry.

A. First method—A chromium oxide film is formed by a vacuum evaporation technique on the surface of a chromium film formed a by vapor deposition technique.

B. Second method—A chromium oxide film is formed by sputtering on the surface of a chromium film formed by sputtering.

C. Third method—A chromium film is formed on the surface of a substrate by vacuum evaporation or sputtering and then the substrate is heated in air or an oxygen atmosphere to convert the surface layer of the chromium film into chromium oxide.

D. Fourth method—A chromium oxide film is formed by vacuum evaporation on the surface of a chromium film formed by sputtering.

However these methods are defective as follows:

1. First method a. It is liable to form pin holes.

When compared with a chromium film formed by sputtering, a chromium film prepared by vacuum evaporation has a higher percentage of pin holes. Of course, pin holes are detrimental to a photomask blank.

b. The film thickness is large, thus degrading pattern resolution.

Assuming that a chromium film formed by vacuum evaporation and a chromium film formed by sputtering have a thickness equal to each other, the former film has a smaller transmittance density than the latter film. Therefore, in order to obtain a transmittance density which is necessary for the mask, the thickness of the film prepared by evaporation should have a large thickness of from about 800 to 1000 Å. However, an increase in the thickness of the chromium oxide film decreases the resolution of the circuit pattern, so that it is impossible to obtain a mask having fine circuit patterns.

2. Second method a. Productivity is poor.

The chromium film formed by sputtering has a large transmittance density so that it is possible to obtain a desired transmittance density with a film thickness of about one half of that of a chromium film prepared by vacuum evaporation. However, as the sputtering speed of chromium oxide is about ⅓ to 1/5 of the speed of sputtering chromium, the productivity of this method is low.

b. The edges of the circuit pattern are rugged or jagged.

Depending upon the property of the chromium oxide film prepared by this method, the edges of the circuit pattern formed by a wet etching technique become rugged, thereby badly affecting resolution. This is also true for a DC reactive sputtering using a mixture of an inert gas and oxygen, and a R.F. sputtering method utilizing a target of chromium oxide. Since oxygen is used in the reactive, sputtering, a vacuum meter, the filament of a vacuum gauge and the diffusion oil utilized are spoiled thus damaging the sputtering device.

3. Third method a. Pin holes and surface foreign matters are formed.

The chemical reaction between an reactive gas in the atmosphere and the alkaline metals in the substrate caused by heating forms surface foreign matters and pin holes which are defects of the mask.

b. The flatness of the substrate is degraded.

Heating of the substrate decreases the flatness of the surface of a polished and ground substrate, so that intimate contact between the photomask and the wafer at the time of exposure cannot be obtained.

4. Fourth method

The chromium mask blank prepared by this method can eliminate the defects of the chromium film prepared by vacuum evaporation and the chromium oxide film prepared by sputtering so that its quality is higher than that of the chromium mask blanks prepared by the first to third methods. However, by experiments we have found the following defects.

a. The anti-reflection performance is not sufficient.

As is well known in the art, the reflectance of a chromium mask blank is determined by the optical constants of chromium and chromium oxide and the film thickness, but the optical constants of these materials differ greatly depending upon the method of forming the films. Especially, in the chromium film, the reflectance of a chromium film formed by sputtering and having a transmission intensity of about 2.5 is about 60%, whereas that of a chromium film formed by vacuum evaporation and having the same transmittance density is about 40%. This is also true for the treatment in an inert gas atmosphere having a relatively wide range of vacuum, that is from $10^{-5}$ to $10^{-6}$ torr for the vapor deposition method and from $10^{-1}$ to $10^{-4}$ torr for the sputtering method. Consequently, with a chromium mask wherein a chromium oxide film is vapor deposited on the surface of a chromium film formed by sputtering it is impossible to provide a sufficient anti-reflection effect and a reflectance of from about several to 10% is inevitable.

b. Acid resistant property is low.

As is well known in the art, chromium mask blanks are washed with a strong acid such as sulfuric acid during the manufacture of the masks and repeated use but the acid resistant property of the chromium masks is low so that when washed repeatedly the chromium oxide films are damaged thus rapidly increasing the reflectance. It is presumed that the bonding force between the chromium film and the chromium oxide film is reduced because a film of different material is formed on the chromium film by different methods.

For the reason described above it has been impossible to obtain a chromium mask having a high resolution, free from pin holes, highly resistant to acid and having a excellent anti-reflection performance from a chromium mask blank.

SUMMARY OF THE INVENTION

Accordingly, it is an object of this invention to provide a novel photomask blank having no pin holes in the mask metal film, excellent acid resistant property, improved resolution and excellent anti-reflection performance and method of manufacturing such photomask blank.

According to one aspect of this invention there is provided a photomask blank comprising a transparent substrate, a first chromium film formed on the substrate by sputtering, a second chromium film formed on the first chromium film by vacuum evaporation, and a chromium oxide film formed on the second chromium film by vacuum evaporation.

According to another aspect of this invention, there is provided a method of preparing a photomask blank comprising the steps of forming a first chromium film on a transparent substrate by sputtering, forming a second chromium film on the first chromium film by vacuum evaporation, and forming a chromium oxide film the second chromium film by vacuum evaporation.

BRIEF DESCRIPTION OF THE DRAWINGS

In the accompanying drawings:

FIG. 1 is an enlarged sectional view of a photomask blank embodying the invention;

FIGS. 2a, 2b and 2c show successive steps of manufacturing the photomask blank shown in FIG. 1.

DESCRIPTION OF THE PREFERRED EXAMPLE

Figure 3:
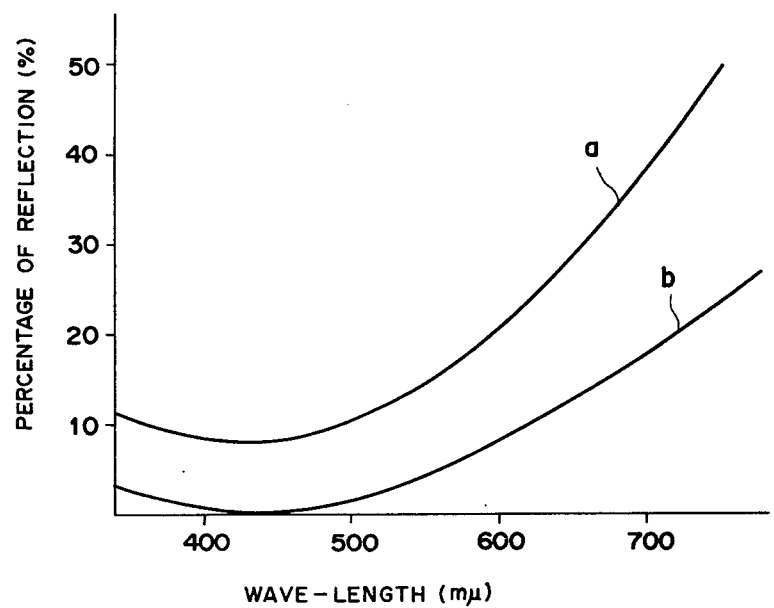
FIG. 3 is a graph including curves for comparing the percentage of reflection of a prior art photomask blank and the photomask blank of this invention.

The photomask blank shown in FIG. 1 comprises a transparent substrate 1 made of glass, for example, a first chromium film 2 formed on the substrate by sputtering, a second chromium film 3 formed on the first chromium film 2 by vacuum evaporation, and a chromium oxide film 4 formed on the second chromium film 3 by vacuum evaporation.

The photomask blank is prepared by the steps shown in FIGS. 2a, 2b and 2c. Thus, the first chromium film 2 is deposited on the glass substrate 1 by sputtering in the belljar of a conventional sputtering device containing an inert gas maintained at a vacuum of about $10^{-1}$ to $10^{-5}$ torr. The sputtering device may be DC or RF (radio frequency) type. The thickness of the first chromium film 2 is selected to be from about 200 Å to 800 Å, so as to provide a transmittance density of about 1.5 to 3. The film of this thickness provides a transmittance density desired for the photomask.

Then, the substrate 1 is transferred into a vacuum evaporation device (not shown) for depositing the second chromium film 3 as shown in FIG. 2b. The vacuum evaporation device may be any conventional type in which chromium material is evaporated by resistance heating, or electron beam heating. Advantageously, the thickness of the vapor deposited chromium film 3 ranges from 100 Å to 300 Å. If the thickness is smaller than 100 Å, the reflectance of the chromium film 3 would not decrease as desired, whereas if the thickness of the second chromium film 3 were larger than 300 Å the total thickness of both films 2 and 3 would become too large, thus decreasing the resolution of the photomask. Regarding the relative thickness of the chromium films 2 and 3, from the standpoint of resolution, it is advantageous to select the overall transmission intensity to be above 2.5.

Thereafter, as shown in FIG. 2c the chromium oxide film 4 is formed on the second chromium film 3 by vacuum evaporation. The chromium oxide film 4 may be formed either by a vacuum evaporation using chromium oxide as source material or a vacuum evaporation in which chromium is evaporated in vacuum under a pressure of oxygen of from $10^{-3}$ to $10^{-5}$ torr. The vacuum evaporation is controlled such that the thickness of the chromium oxide film 4 will be in a range of from 150 Å to 400 Å. While the g- and h-line of a mercury lamp is generally used as an exposure light for preparing circuit patterns, with a film thickness of less than 150 Å and more than 400 Å of the chromium oxide film 4, the reflectance at g- and h-line is high. This is unfavorable.

A preferred embodiment of this invention will now be described in detail.

A glass substrate usually used for photomasks was disposed to oppose a pure chromium target in a belljar of a three electrode DC sputtering apparatus maintained at a vacuum of $10^{-3}$ torr for forming a first chromium film having a thickness of about 400 Å. Then, the substrate was transferred into a conventional vacuum evaporation tank to deposit a second chromium film having a thickness of about 200 Å while maintaining a vacuum of $5 \times 10^{-6}$ torr in the deposition tank. Thereafter, oxygen was admitted into the deposition tank and after adjusting the vacuum to $5 \times 10^{-3}$ torr, the vapor deposition was continued to form a chromium oxide film having a thickness of about 300 Å. Table 1 below shows various data of the photomask blank prepared by this embodiment and of the photomask blanks prepared by the first and fourth methods described above. Curve a in FIG. 3 shows the reflectance of a photomask blank prepared by the aforesaid conventional fourth method while curve b shows that of the photomask blank of this embodiment.

Table 1

| type of mask blank | Total film thickness (Å) | pin holes * | minimum percentage of reflection | conc. sulfuric acid test ** | amount of side etching *** |
|---|---|---|---|---|---|
| mask blank of the embodiment | 900 | <0.2/cm² | 0 % | >120 min. | 0.05 μ |
| mask blank prepared by the first method | 1200 | 1-3/cm² | 0 % | 40 min. | 0.15 μ |

Table 1-continued

| type of mask blank | Total film thickness (Å) | pin holes * | minimum percentage of reflection | conc. sulfuric acid test ** | amount of side etching *** |
|---|---|---|---|---|---|
| mask blank prepared by the fourth method | 800 | <0.2/cm² | 5 – 10 % | 20 min. | 0.1 μ |

*After cleaning by a 200 W ultra sonic wave for 10 minutes, observed under a microscopes of 100 magnifying power
**The durable time until the minimum reflectance exceeds 20 %
***The amount of decrease in the pattern width per 10 seconds when a conventional etching solution was used containing cerium sulfate.

As can be clearly noted from the foregoing description and FIG. 3, the photomask blank of this invention has the following advantages and can eliminate all defects of the prior art photomask blanks.

1. Can efficiently prevent reflection.

As shown in FIG. 3 the minimum percentage of reflection of the photomask blank of this invention is substantially equal to zero and has a lower percentage of reflection than the photomask blank prepared by the fourth method over the entire wavelength range of the visible light. This means that the chromium oxide film of this invention perfectly prevents the surface reflection, whereby degradation due to the multiple reflection between the mask and the wafer is prevented in the printing process.

2. Can resist against chemicals.

As can be noted from Table 1, the resistance to sulfuric acid of the photomask blank of this invention is excellent. It is considered that the vapor deposited chromium film improves the adhesion of the chromium oxide film.

3. The resolution of the circuit pattern is high.

It is possible to decrease the overall film thickness since the provision of the sputtered chromium film decreases the overall film thickness, whereby the edges of the circuit pattern are sharply defined to increase the resolution.

4. Substantially free from any pin hole.

Since the first chromium film is prepared by sputtering, substantially no pin hole is formed.

5. The amount of side etching is small.

It is said that the amount of side edges, that is the amount of corrosion of the films parallel to the surface of the substrate increases with the number of the films. As can be clearly noted from Table 1 the amount of side etching of the photomask of this invention is the same as that of the chromium film formed by sputtering, thus ensuring stable etching.

It should be understood that the invention is not limited to the specific embodiment described above and that many changes and modifications will be obvious to one skilled in the art without departing from the spirit and scope of the invention as defined in the appended claims.

What is claimed is:

1. A photomask blank comprising a transparent substrate, a first chromium film formed on said substrate by sputtering, a second chromium film formed on said first chromium film by vacuum evaporation, and a chromium oxide film formed on said second chromium film by vacuum evaporation.

2. A photomask blank according to claim 1 wherein said first chromium film has a thickness of from 200 to 800 Å, said second chromium film has a thickness of from 100 to 300 Å and said chromium oxide film has a thickness of from 150 to 400 Å.

3. A method of preparing a photomask blank comprising the steps of forming a first chromium film on a transparent substrate by sputtering, forming a second chromium film on said first chromium film by vacuum evaporation, and forming a chromium oxide film on said second chromium film by vacuum evaporation.

4. A method according to claim 3 wherein chromium oxide is used as evaporation material in said step of forming said chromium oxide film.

5. A method according to claim 3 wherein said step of forming said chromium oxide film comprises evaporating chromium in a vacuum chamber under the pressure of oxygen of from $10^{-3}$ to $10^{-5}$ torr.

* * * * *